United States Patent [19]

Nishiwaki et al.

[11] Patent Number: 5,307,184
[45] Date of Patent: Apr. 26, 1994

[54] EXPOSURE APPARATUS

[75] Inventors: Seiji Nishiwaki, Osaka; Junichi Asada, Ibaraki; Shinji Uchida, Neyagawa, all of Japan

[73] Assignee: Matsushita Electric Industrial Co., Ltd., Kadoma, Japan

[21] Appl. No.: 47,349

[22] Filed: Apr. 19, 1993

Related U.S. Application Data

[63] Continuation of Ser. No. 846,807, Mar. 5, 1992, abandoned.

[30] Foreign Application Priority Data

Mar. 13, 1991 [JP] Japan ................. 3-047878

[51] Int. Cl.⁵ .................. G03H 1/04; G02B 27/42
[52] U.S. Cl. .......................... 359/30; 359/35; 359/494; 359/559; 359/564
[58] Field of Search ............. 359/10, 11, 30, 31, 359/495, 496, 35, 494, 559, 564

[56] References Cited

U.S. PATENT DOCUMENTS

| | | | |
|---|---|---|---|
| 2,770,166 | 11/1956 | Gabor | 359/31 |
| 3,610,723 | 10/1971 | Spitz | 359/40 |
| 4,824,191 | 4/1989 | Kato et al. | 359/495 |
| 5,081,540 | 1/1992 | Dufresne et al. | 359/495 |
| 5,111,312 | 5/1992 | Stewart | 359/11 |

FOREIGN PATENT DOCUMENTS 53-129665  11/1978  Japan ................. 359/30

OTHER PUBLICATIONS

Nishihara et al., *Optical Integrated Circuits*, OHM Co., 1985, pp. 216–221.
Matsushita, *Fundamentals And Experiments Of Holography*, Kyoritsu Press Co., 1979, pp. 16 to 19.

*Primary Examiner*—Martin Lerner
*Attorney, Agent, or Firm*—Cushman, Darby & Cushman

[57] ABSTRACT

An exposure apparatus capable of making exposure for concentric circular periodic grating is provided with a quarter-wave plate (4), an ND filter (8a) having stepwisely different transmissions with boundaries of circle or a group of circles, an axially symmetric-shaped patterning mask (8b), an interference lens (9), before a sample substrate (10) having a photosensitive film (11). The interference lens (9) has a form of rotation symmetry with respect to optical axis (9L), and its incident surface (9P) is a flat plane, and its exit surface (9S) is a surface of revolution which is close to a circular cone.

14 Claims, 14 Drawing Sheets

5,307,184

EXPOSURE APPARATUS

This is a continuation of application Ser. No. 07/846,807, filed on Mar. 5, 1992, now abandoned.

FIELD OF THE INVENTION AND RELATED ART STATEMENT

1. Field of the Invention

The present invention relates to an apparatus capable of exposing concentric circular periodic grating patterns.

DESCRIPTION OF THE RELATED ART

In recent years, research and development of new optical elements of planar configuration such as grating lens, Fresnel lens, concentric circular grating coupler, or concentric circular focusing grating coupler have been actively conducted, and research and development has also been undertaken on exposure method and exposure apparatus of concentric circular periodic grating patterns for making optical elements mentioned above.

Referring to the drawings, as an example of conventional grating pattern exposure apparatus, explanation is given on the two-beam interference method (holographic interference method), which is described in, for example, "Optical Integrated Circuits" (Hiroshi Nishihara and others, Ohm Co., 1985) pp. 216-220, or "Fundamentals and Experiments of Holography" (Akira Matsushita, Kyoritsu Press Co.) pp. 17-18. FIG. 1 shows a constitutional drawing of an exposure apparatus in this conventional example. In FIG. 1, numeral 1 is a laser apparatus such as an Ar or He-Cd laser, numeral 2 is a shutter, numerals 50 and 51 are reflecting mirrors, numeral 3 is a variable attenuator, numeral 5 is a beam expander lens, numeral 6 is a spatial filter, numeral 7 is a collimator lens, numerals 52 and 53 are convex lenses, numeral 10 is a sample substrate, and numeral 11 is a photosensitive film formed over the sample substrate. A laser light 101 issued from the laser light source 1 has its transmission controlled by the shutter 2, and is its light amount is adjusted stepwisely by the variable attenuator 3, and then converted into a converging light by the beam expander lens 5 to be focused on an aperture of the spatial filter 6. The laser light passing through this aperture is converted into a plane-wave beam whose diameter is expanded by the collimator lens 7 (insertion of the spatial filter 6 is for removing noises caused by defects or stains on lenses and mirrors). This plane-wave beam is converted into a converging light 54a by a convex lens 52 having a long focal length, while a part of this converging light is converted into a diverging light 54b by a convex lens having a short focal length. Then, these two light fluxes are projected onto a sample substrate 10. If the optical lengths and the intensities on these two light fluxes are approximately equal, a concentric circular interference pattern of a pitch corresponding to the incident angle of each flux is formed with a high contrast, thus enabling satisfactory illumination on the photosensitive material 11 to make an exposure of a periodic pattern.

FIG. 2(a) is an explanatory drawing showing the principle of forming a periodic pattern by an exposure apparatus of prior art, and FIG. 2(b) is an explanatory sectional view of a grating after the development. As is shown in FIG. 2(a), an interference pattern produced by the light fluxes 54a and 54b of a wavelength $\lambda$, which impinge the substrate surface with respective incident angles of $\theta_A$ and $\theta_B$, has a period $\Lambda$ in the direction of the incident plane (in the direction of the radius vector) and is expressed by the following Equation 1.

$$\Lambda/\lambda = 1/(\sin\theta_A + \sin\theta_B). \qquad \text{(Equation 1)}$$

On the photosensitive film after the development is obtained a grating 55 of a concentric circular shape as shown in FIG. 2(b).

It is known that the methods of the prior art have advantages such as: (1) a grating pattern can be made relatively easily, and (2) a grating of a wide area can be formed.

In the exposure apparatus mentioned above, the following problems are present. Namely, (1) position adjustment (adjustment of 3-dimensional positional relation and angles) of the convex lenses 52 and 53 is difficult; in particular, as the numerical aperture of the lenses 52 and 53 becomes large (in other words, as the grating pattern pitch is reduced, tolerance of the positional adjustment becomes narrower; and hence error in the grating pattern becomes large, and thus a high periodicity accuracy and a superior period uniformity become hard to obtain. (2) Since the light flux 54a is obstructed by the lens 53 in the vicinity of the optical axis, in order to suppress its influence it is desirable to limit the numerical aperture of the lenses 52 and 53; and in conjunction with the above-mentioned problem, this makes the reduction of the pitch of the grating pattern difficult. (3) The incident angles $\theta_A$ and $\theta_B$ toward the substrate are zero on the optical axis and become large as the light diverges from the optical axis. Therefore, a grating pattern obtained by an exposure apparatus of the prior art is limited to a chirped grating (such as grating lens, Fresnel lens) in accordance with a modulation characteristic wherein the pitch at the center of the pattern in zero; and it is not capable of exposing a concentric circular periodic grating pattern having modulation characteristics other than the above-mentioned characteristic (such as concentric grating coupler, concentric focusing grating coupler).

DISCLOSURE OF THE INVENTION

In view of the problems described above, the present invention provides for an exposure apparatus, which is simple, of low cost, and accurate in its pattern periodicity and uniformity, and further is capable of exposing concentric circular periodic patterns with modulated pitch in the radial direction.

The exposure apparatus of the present invention comprises: a laser light source, a refractive body for letting the laser light transmit therethrough and refract, and a photosensitive film formed on a flat plane which is substantially perpendicular to the optical axis of the laser light, wherein the improvement is that the refracting surface of said refractive body is a surface of revolution having the optical axis as its axis of revolution, and light fluxes refracting at respective paired diagonal generatrices of the refracting surface intersect to each other in the vicinity of the optical axis, and interfere to each other to form a fringe having concentric circular periodic bright and dark parts, whereto the photosensitive film is exposed.

According to the present invention, concentric circular periodic grating patterns having pitch modulated in the radius vector direction can be exposed with a good contrast, and a fine control of the period modulation is also achievable by the position adjustment of the exposure plane. By a further combination with the patterning mask, the exposure region can be specified, and a combination of grating patterns with different exposure conditions on the same exposure plane becomes possible.

Furthermore, the apparatus can be constructed of a simple combination of a laser light source and low-cost optical elements. And since the accuracy of the periodic pattern is determined by the accuracy of optical lenses which generally have a long life as high-accuracy fabricated elements, an excellent periodicity accuracy is achievable. Further, since the exposure area is determined by the size of the lens, exposures of large areas become possible.

DESCRIPTION OF THE PREFERRED EMBODIMENTS

Figure 1:
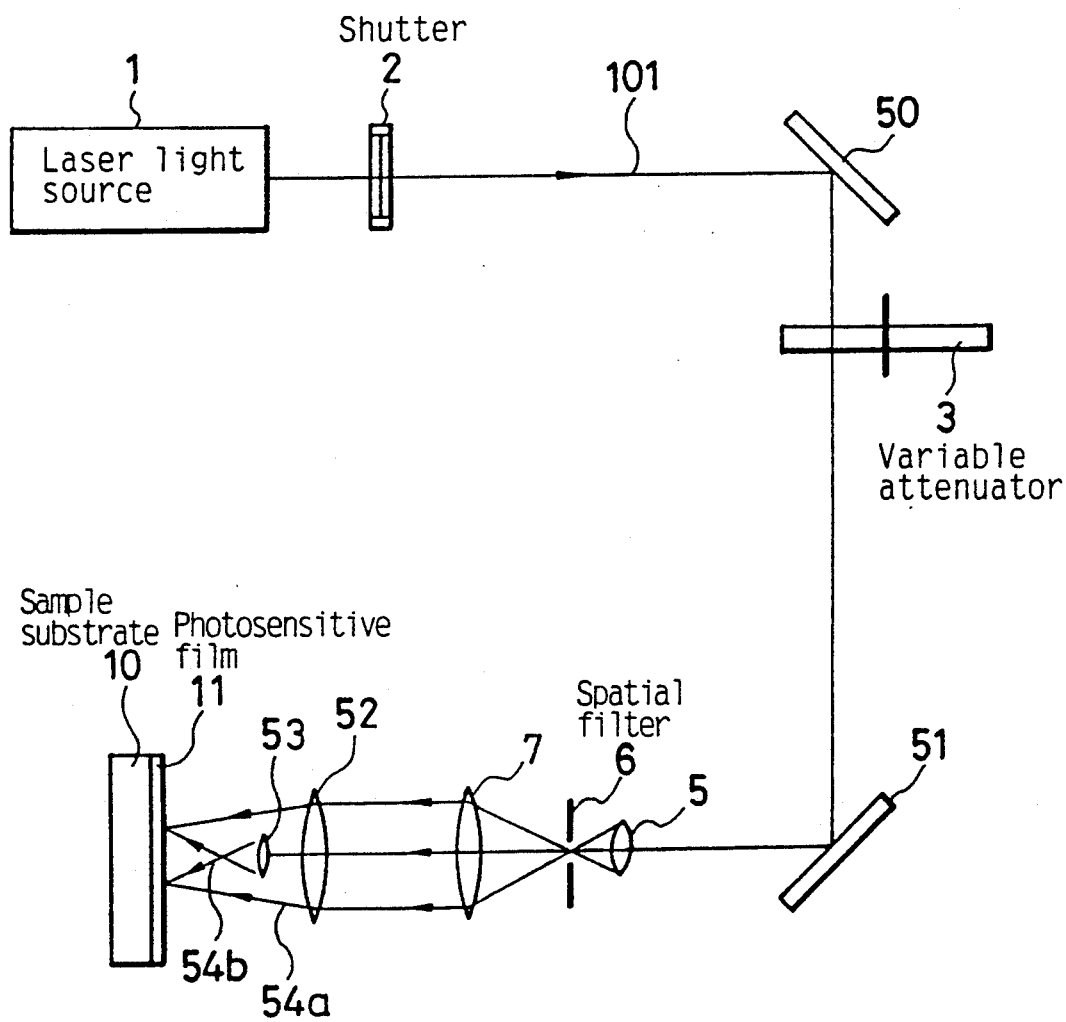
FIG. 1 is a sectional view of a configuration drawing of an exposure apparatus in prior art, FIG. 2 (a) is an explanatory drawing showing the principle of forming a periodic pattern by the exposure apparatus of the prior art.
Figure 2A:
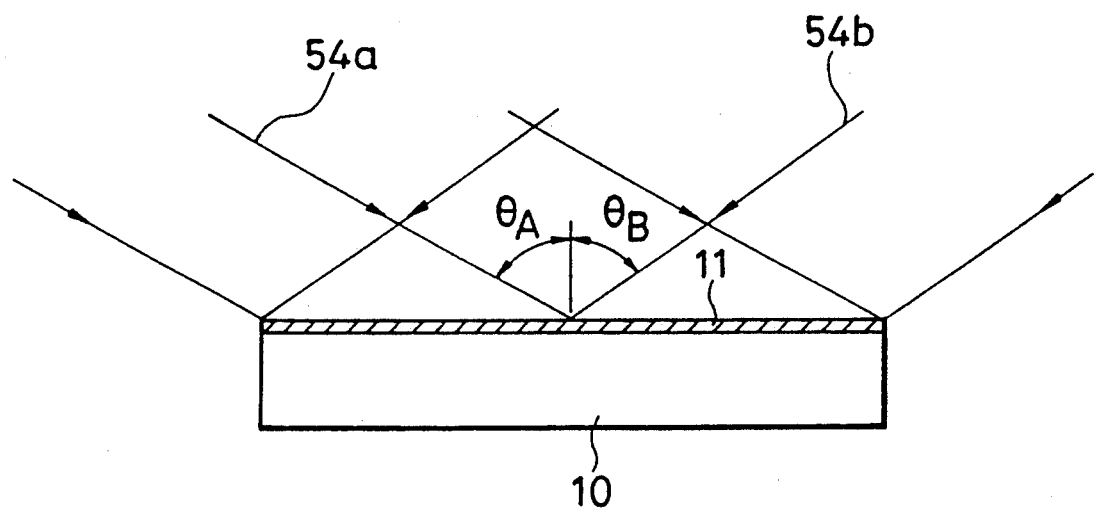
FIG. 2(b) is an explanatory sectional view of the grating after the development.
Figure 2B:
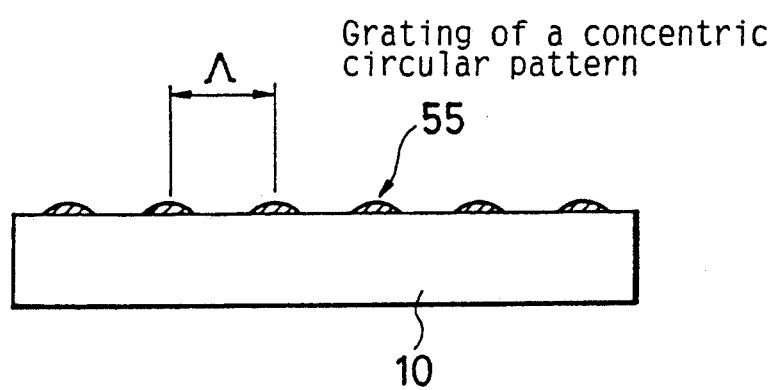

In the following, explanation is given of an exposure apparatus of one embodiment of the present invention referring to the drawings. Hereupon, the explanation is given using the same numerals on the same parts as those in the prior art.

Figure 3:
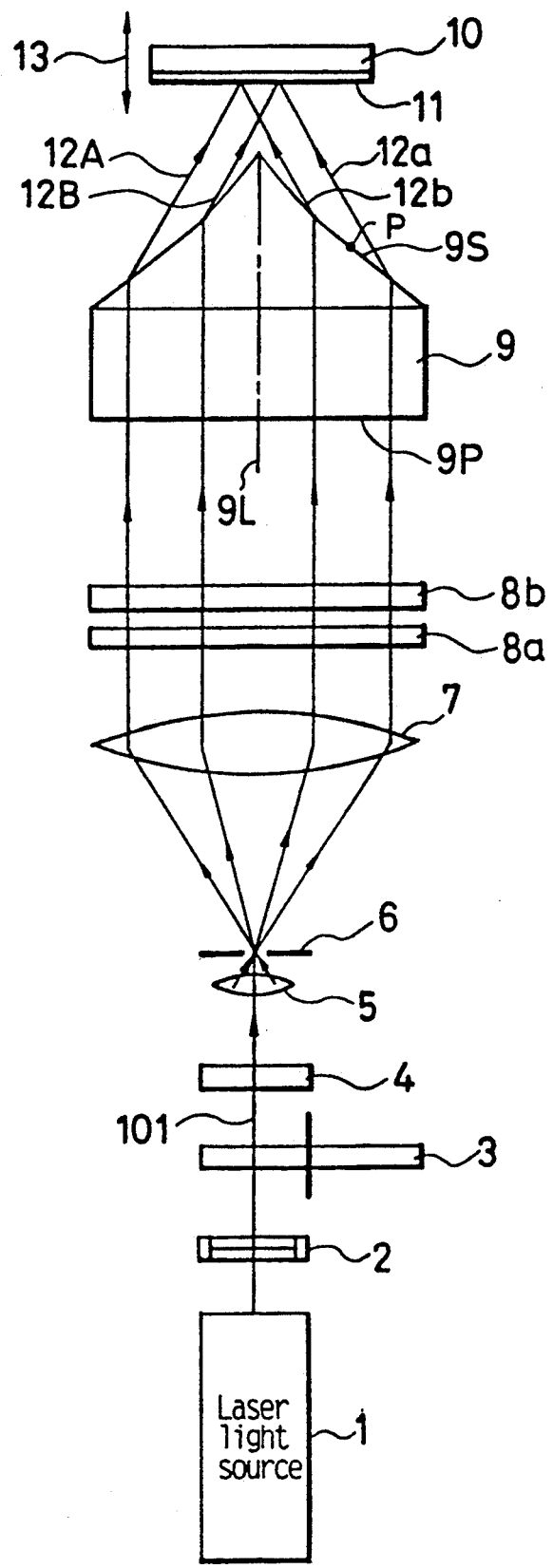
FIG. 3 is a sectional view of a constitutional drawing of an exposure apparatus of a first embodiment of the present invention.

FIG. 3 shows a cross-sectional view of a constitutional drawing of an exposure apparatus of one embodiment of the present invention. As shown in FIG. 3, light emitted from a laser light source 1, is led through a shutter 2, a variable attenuator 3, a quarter-wave plate 4, a beam expander lens 5, a spatial filter 6, a collimator lens 7, a ND filter 8a, a patterning mask 8b, and an interference lens 9, to a photosensitive film which is formed on a sample substrate 10. The ND filter 8a has different transmission regions having the bounderies of a circle or a group of circles whose center is set at the optical axis of the system, and the patterning mask 8b is a light-masking film, which has a pattern of axial symmetry formed on a transparent substrate. The symmetric axis (center axis) of the light-masking film 8b is adjusted in a manner to coincide with the center axis 9L of the interference lens 9, by means of a known X-Y axis translation stage. The interference lens 9 has a form of rotation symmetry with respect to its axis 9L, an incident surface 9P of a flat plane, and an exit surface 9S formed in a surface of revolution close to the circular conical surface. The interference lens 9 is constituted on or fixed to the X-Y axis translation stage and also on an X-Y axis tilting stage, and thereby, the center axis 9L is adjusted in a manner to coincide with the optical axis of the laser beam 101. The sample substrate 10 is constituted on or fixed to an X-Y-Z axis translation stage and also on or to an X-Y axis tilting stage, and thereby it is adjustable in a manner that the surface of the sample substrate 10 intersects perpendicularly with respect to the center axis 9L. The sample substrate 10 is also adjustable along the axis 9L, namely in the direction along an arrow mark 13.

The operation of the above described embodiment of the present invention will now be explained with reference to FIG. 3 through FIG. 12.

In FIG. 3, transmission of the light issued from the laser light source 1 is controlled by a shutter 2, and its light intensity is adjusted stepwisely by a variable attenuator. This light beam is converted into a circularly polarized light by letting it pass through the quarter-wave plate 4, being converted into a converging beam by the beam expander lens 5 and then being focused inside a circular aperture of the spatial filter 6. Thus, passing through the filter 6, the light is converted into a plane wave whose beam diameter is expanded by the collimator lens 7. This plane wave passes through the ND filter 8a and then the patterning mask 8b. Thereby, a fraction of the plane wave is attenuated and masked, and then hits the incident surface 9P of the interference lens 9 at a right angle. Then, the plane wave is refracted at the exit surface 9S as shown by light rays 12a, 12b, 12A, and 12B, finally to be projected onto the photosensitive film 11. The insertion of the quarter-wave plate 4 is in order to keep the rotation symmetry of the light as a vector wave by making it into a circularly polarized light. This is in order to keep the rotation symmetry of the interference fringe.

This measure is effective to prevent the following conventional problems that are caused by the refraction of the linearly polarized light:

(1) the amount of the refracted light depends upon the relative directional relation between the oscillating plane of light vector and the direction normal to the plane in which the refraction takes place (that is, the polarization angle with respect to the direction of the normal of the plane at which the refraction takes place) and hence an intensity variation corresponding to the position of refraction takes place and, (2) the interference at the exposure plane induced by the slant incidence of the refracted light depends upon the direction of the oscillating plane of light vector.

As shown in FIG. 3, light rays 12a and 12A and light rays 12b and 12B are respectively placed at mutually diagonal positions with respect to the center axis 9L on the same circle. And, over the plane of photosensitive film 11, the light ray 12a interferes with the light ray 12B which is on a circle slightly inside a circle whereon the light ray 12a is, whereas the light ray 12A interferes with the light ray 12b which is on a circle slightly inside a circle on which the light ray 12A is.

Thus as a whole, a concentric circular interference fringe area having its center on the center axis 9L is formed. By developing an exposed pattern thus obtained, a concentric circular periodic grating pattern can be formed.

Figure 4:
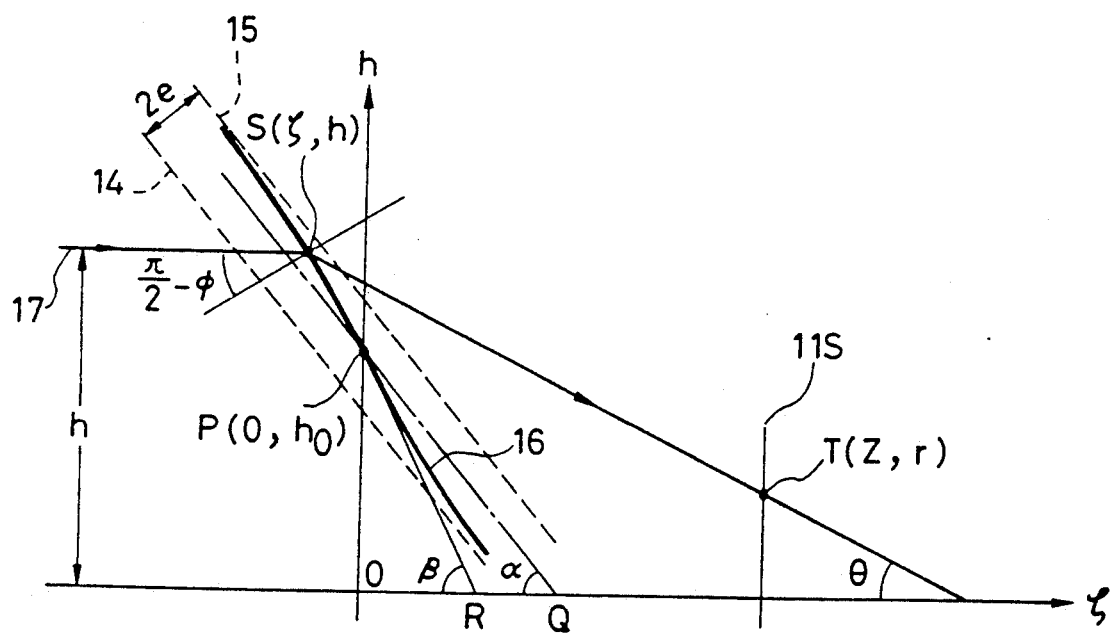
FIG. 4 is an explanatory drawing showing the relation between a cross-sectional shape of an exit plane of an interference lens of an exposure apparatus and the refracted light ray in a first embodiment of the present invention.

FIG. 4 shows a relation between a sectional shape of the exit surface of the interference lens and the refracted light rays in the exposure apparatus of the embodiment of the present invention. The exit surface 9S of the interference lens is formed as a surface of revolution having a curve 16 as its generatrix curve and a $\zeta$ axis (center axis 9L) as its axis of revolution. The curve 16 has two asymptotes which are parallel straight lines 14 and 15 both forming the intersecting angle $\alpha$ with respect to the $\zeta$ axis, and has an inflection point P. Let us consider an orthogonal coordinate which has the foot of a perpendicular to the $\zeta$ axis as an origin 0, and is composed of an h axis (OP axis) and the $\zeta$ axis. Then, the point P is expressed by (0, h$_0$) and the curve 16 is expressed by the following Equation 2:

$$h = -\zeta \tan\alpha + h_0 - \qquad \text{(Equation 2)}$$

$$\zeta \epsilon/\cos\alpha \{|\zeta|^a + |\epsilon/\cos\alpha(\tan\beta - \tan\alpha)|^a\}^{1/a}.$$

In the Equation 2, $2\epsilon$ is a distance between mutually parallel lines 14 and 15, $\beta$ ($>\alpha$) is a gradient ($=\angle$ PRO) of the curve 16 at the point P, and a is a coefficient concerning the speed of asymptotic property of the curve.

Let us assume that: light rays 17, which pass inside the interference lens of a refractive index n at a height h, intersect with the curve 16 at a point S ($\zeta$,h) on the exit surface 9S, with an incident angle of $\pi/2 - \phi$; and that, the light rays 17 are refracted to hit a point T (z,r) with an angle $\theta$ on a photosensitive surface 11S, which is perpendicular to the $\zeta$ axis. Then, by differentiating Equation 2 by $\zeta$, the angle $\phi$ can be expressed by the following Equation 3:

$$\tan\phi = \tan\alpha + (\epsilon/\cos\alpha)^{a+1}/ \qquad \text{(Equation 3)}$$

$$\{|\tan\beta - \tan\alpha|^a \{|\zeta|^a + |\epsilon/\cos\alpha(\tan\beta - \tan\alpha)|^a\}^{1+1/a}.$$

And Snell's equation at the point S is expressed by the following Equation 4:

$$n \cos\phi = \cos(\phi - \theta). \qquad \text{(Equation 4)}$$

Therefore, the following Equation 5 holds concerning the position of a point T:

$$r = h - (z - \zeta)\tan\theta. \qquad \text{(Equation 5)}$$

And the light intensity I over the surface of the photosensitive film and the contrast $\Gamma$ are expressed respectively by the following Equation 6 and Equation 7, therein denoting the transmission distribution of the ND filter 8a by T and the intensity of the incident light 17 by TI$_0$:

$$I/I_0 = T h dh/r dr + T^* h^* dh^*/r dr, \qquad \text{(Equation 6)}$$

$$\Gamma = 2(T h dh/r dr \cdot T^* h^* dh^*/r dr)^{\frac{1}{2}}/(I/I_0) \qquad \text{(Equation 7)}$$

where h$^*$ and T$^*$ are given by h$^*$=h(−r) and T$^*$=T(−r), by expressing h and T as functions of r, that is h=h(r) and T=T(r).

Then, by gradually reducing the value of $\zeta$ from h$_0$/tan $\alpha - \epsilon$/sin $\alpha$, h/h$_0$ is obtained from Equation 2, $\phi$ is obtained from Equation 3, $\theta$ is obtained from Equation 4, and further r/h$_0$ is obtained from Equation 5, respectively.

Figure 5:
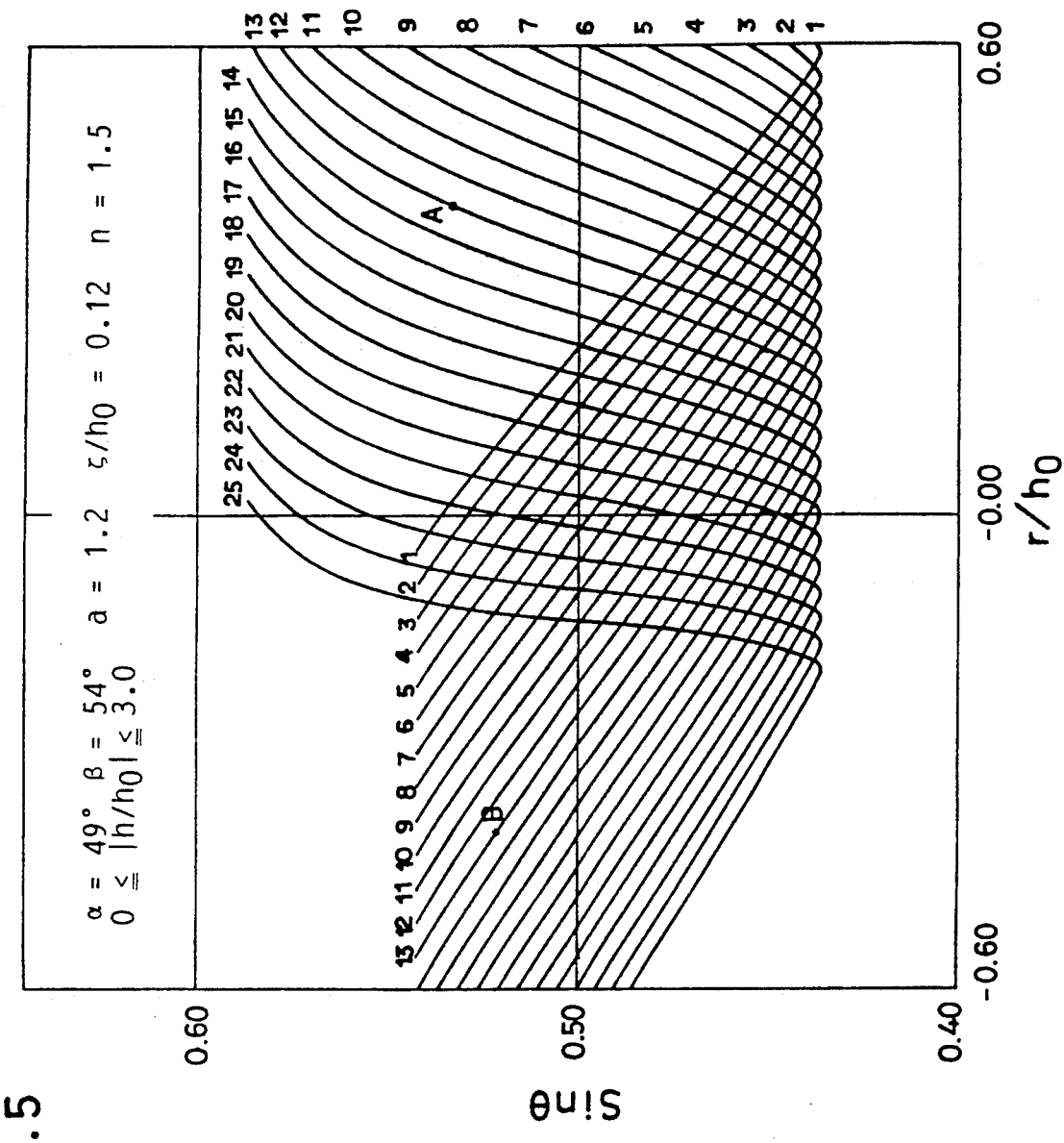
FIG. 5 is an explanatory drawing showing the relation between the incident angle sine $\sin \theta$ and the exposure position (radius vector) $r/h_0$ in the interference region in the first embodiment of the present invention.
Figure 6:
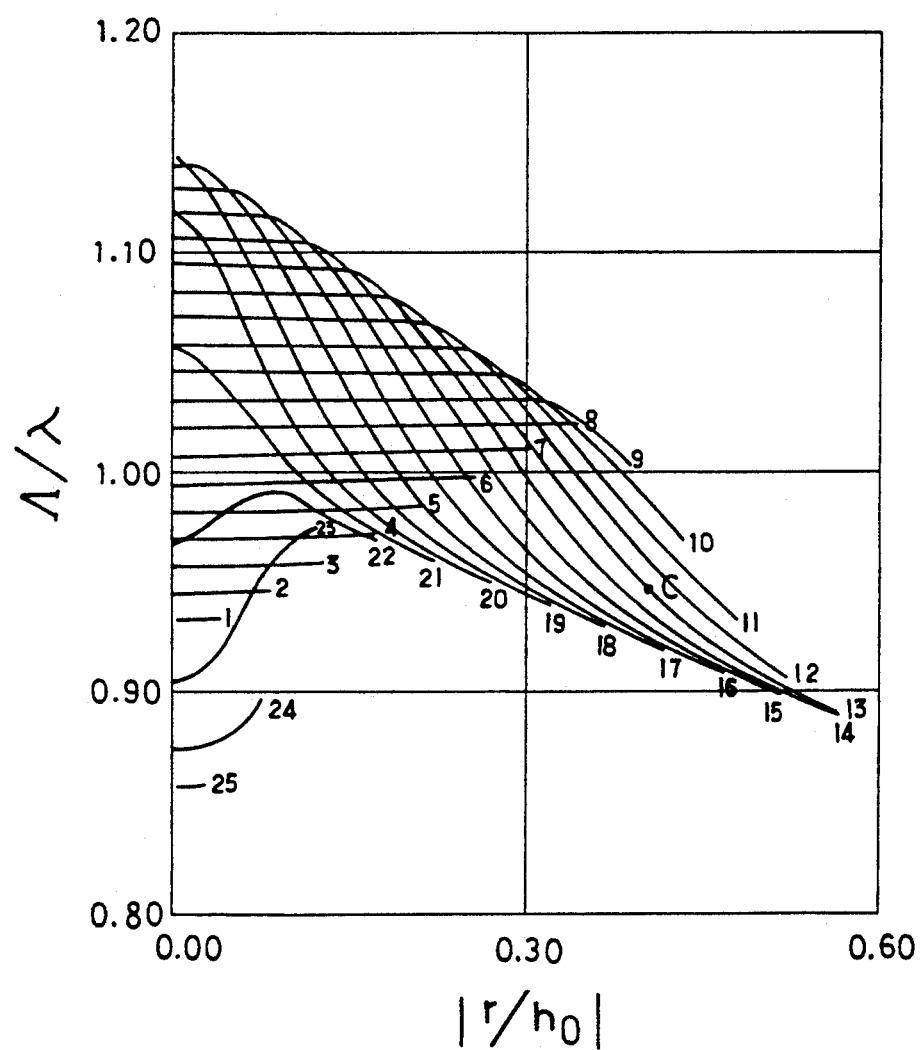
FIG. 6 is an explanatory drawing showing the relation between a patterning pitch $\Lambda/\lambda$ and the radius vector $|r/h_0|$ in the first embodiment of the present invention.

FIG. 5 shows a calculated result showing a relation between the sine of incident angle, sin $\theta$, and the exposure position r/h$_0$ (radius vector) in a case of assuming $\alpha=49°$, $\beta=54°$, a=1.2, $\epsilon$/h$_0$=0.12, n=1.5, and $0 \leq |h/h_0| \leq 3$. In the figure, curves 1-25 take z/h$_0$ as their parameters, and they are in the order in which the photosensitive film surface 11S diverges from the point Q. In case of the curve 13 as an example, positions of points A and B are taken to be (r/h$_0$, sin $\theta_A$) and (−r/h$_0$, sin $\theta_B$), and then the pitch $\Lambda$ of the interference fringe at a position of radius r is given by Equation 1. FIG. 6 is a calculated result showing a relation between the patterning pitch $\Lambda/\lambda$ and the radius vector $|r/h_0|$ obtained based on FIG. 5 and Equation 1. In the figure, curves 1 through 25 correspond respectively to curve numbers in FIG. 5. They are drawn in the order that the photosensitive film surface 11S diverges from the point Q. A point C on the curve 13 corresponds to the points A and B in FIG. 5. As is evident from FIG. 6, the pitch $\Lambda$ is a function of the radius vector r, and it can take a value which is less than the wavelength $\lambda$, and moreover, even directly on the optical axis (r=0) a concentric circular grating can be formed. It is understood that the pitch of the grating pattern can be modulated in the radius vector direction. In particular, by letting the generatrix curve 16 have a point of inflection, the patterning pitch can effectively be made narrow accompanying to increase of the radius vector, and is suitable for the exposure of grating patterns having a large pitch modulation ratio (ratio of maximum pitch at the innermost circle to the minimum pitch at the outermost circle) as is required in a grating lens or concentric circular focusing grating coupler. By the position adjustment of the exposure plane, the pitch modulation of the grating pattern can be finely adjusted since, for example, the curve 13 is replaced by the curve 14. Therefore, the fabrication error of the interference lens or its other fabrication/adjustment errors can also be compensated by the position adjustment of the exposure plane.

Figure 7:
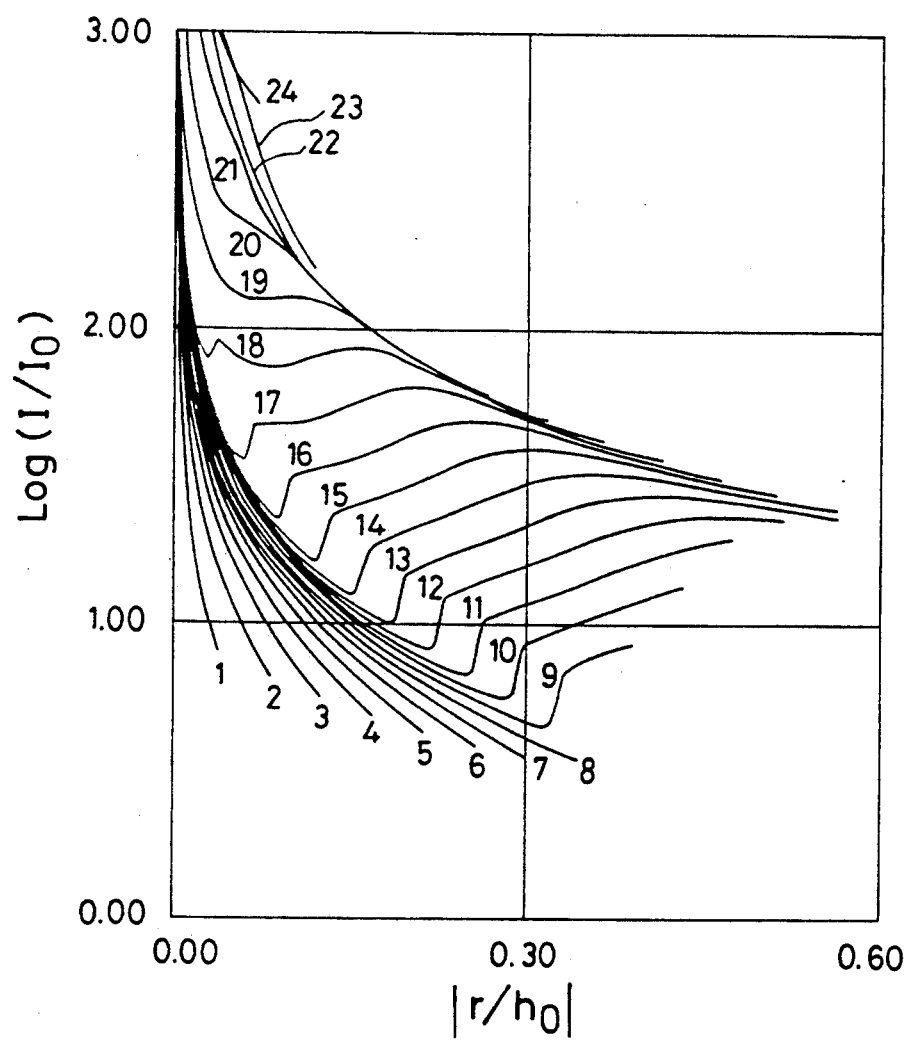
FIG. 7 is an explanatory drawing showing the relation between the light intensity $I/I_0$ on the exposure plane and the radius vector $|r/h_0|$ in the first embodiment of the present invention.

FIG. 7 is a calculated result showing a relation between the light intensity $I/I_0$ on the exposure plane and the radius vector $|r/h_0|$ obtained based on FIG. 5 and Equation 6, wherein curves 1 to 24 correspond respectively to the curve numbers in FIG. 5. Any of these curves shows a slow variation on their outer peripheral part, and on their inner part it shows a rapid increase. Therefore, exposure condition differs depending on the outer peripheral part and the inner peripheral part, and it becomes necessary to make their exposures separately.

Figure 8A:
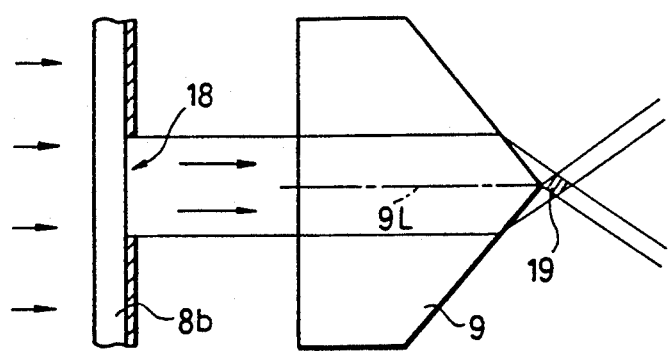
FIGS. 8A, 8B and 8C are explanatory drawings showing the relation between the cross-sectional shape of the patterning mask of the exposure apparatus and the cross-section of the light interference region in the first embodiment of the present invention.
Figure 8B:
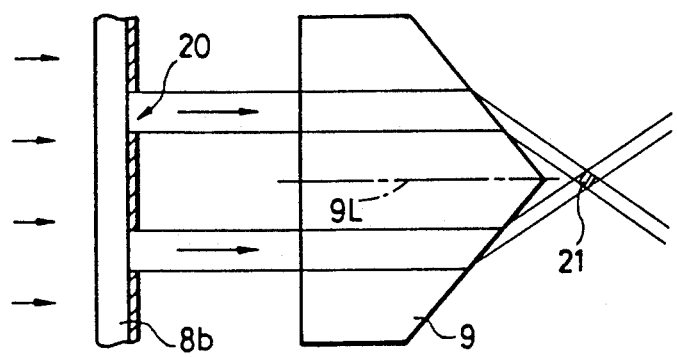
Figure 8C:
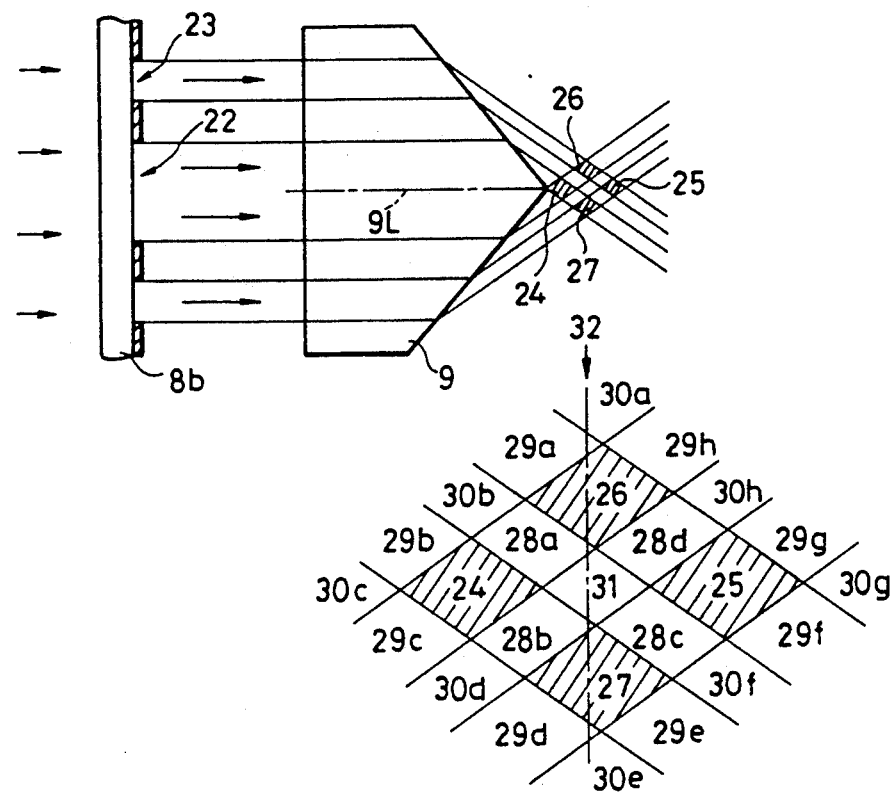

FIG. 8 shows the relation between cross-sectional shapes of the patterning mask and the cross-sectional shapes of the interference regions in the embodiment of the present invention. As in FIG. 8(a), when the patterning mask 8b makes the light masking of a region other than a central circular region 18 which is concentric with the center axis 9L of the interference lens 9, the cross-section of the interference region along the optical axis becomes an almost rhomb shape 19. In such a case that the mask 8b makes the light masking of a region other than a circular ring region 20 which is concentric with the center axis 9L as shown in FIG. 8(b) also, the cross-section of the interference region is also a substantially rhomb shape 21. In such a case that the mask 8b makes the light masking of regions other than a circular region 22 and a circular ring region 23 which are concentric with the center axis 9L as shown in FIG. 8(c), the cross-section of the interference regions become a plurality of substantially rhomb shapes 24, 25, 26, and 27. Hereupon, those regions touching with these rhomb shape regions, 28a, 28b, 28c, 28d, and 29a, 29b, 29c, 29d, 29e, 29f, 29g, 29h are regions in which the light passes through but interference does not take place (no two light fluxes to make mutual interference exist), and other regions 30a, 30b, 30c, 30d, 30e, 30f, 30g, 30h, and 31 are regions through which the light does not pass at all. Therefore, by using masks of FIGS. 8(b) and (c) properly, that is, exposure of the inner part 21 is made using the mask 8(b) (at this time, the outer peripheral side is the region through which the light does not pass at all and hence this part is not exposed), whereas exposure of regions of the outer peripheral sides 26 and 27 is made using the mask FIG. 8(c) (at this time, the inner side corresponds to the region 31 and hence this part is not exposed), then the exposure of respective regions can be done independently.

Figure 9:
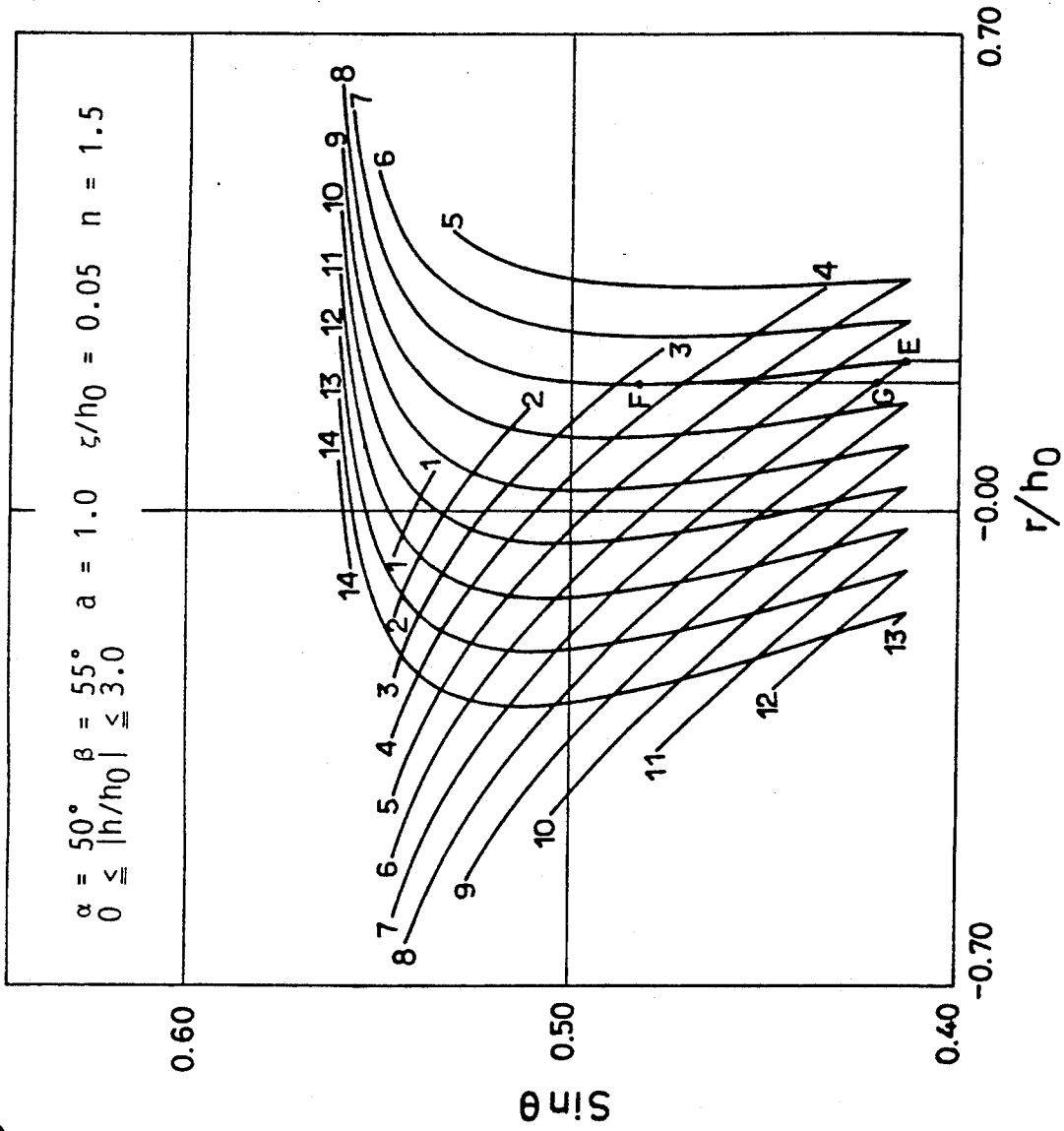
FIG. 9 is an explanatory drawing showing the relation between the sine of incident angle $\sin \theta$ and the exposure position (radius vector) $r/h_0$ in the interference region in such a case that the design value of an interference lens is changed in the first embodiment of the present invention.

Besides the above, the patterning mask has also the following effects. FIG. 9 is a calculated result showing the relation between $\sin\theta$ and $r/h_0$ in the interference regions in a case of changing the designing value of the interference lens ($\alpha=50°$, $\beta=55°$, $a=1.0$, $\epsilon/h_0=0.05$, $n=1.5$, and $0 \leq |h/h_0| \leq 3$). In the figure, curves 1 to 14 take $z/h_0$ as their parameter and are drawn in an order that the photosensitive film surface 11S is diverges from the point Q of FIG. 4. Different from the result of FIG. 5, curves become multivalued functions with respect to r. This is because the radius of curvature in the vicinity of the point of inflection of the generatrix curve shown by Equation 2 is small and the change of the refracting angle of light becomes large. Taking the curve 7 as an example, the value of $r/h_0$ increases up to a point E (0.217, 0.413) of FIG. 9 (which corresponds to $|h/h_0|=1.0$, that is, corresponds to a position of inflection point), and thereafter it decreases; and then passing through a minimum value at a point F (0.185, 0.483) of FIG. 9 (which corresponds to $|h/h_0|=1.0$, that is, again. Therefore, in a region of $0.185 \leq |r/h_0| \leq 0.217$, there are four light fluxes in total, and hence no interference fringe is formed. In this case, if a region from a point G (0.185, 0.420) of FIG. 9 (which corresponds to $|h/h_0|=0.981$) to a point F drops out, the curve 7 becomes a single-valued function, and interference fringes can be formed in the total region. That is, if we use a patterning mask for a circular ring region of $0.981 \leq |h/h_0| \leq 1.24$, the interference region can be expanded effectively.

Figure 10:
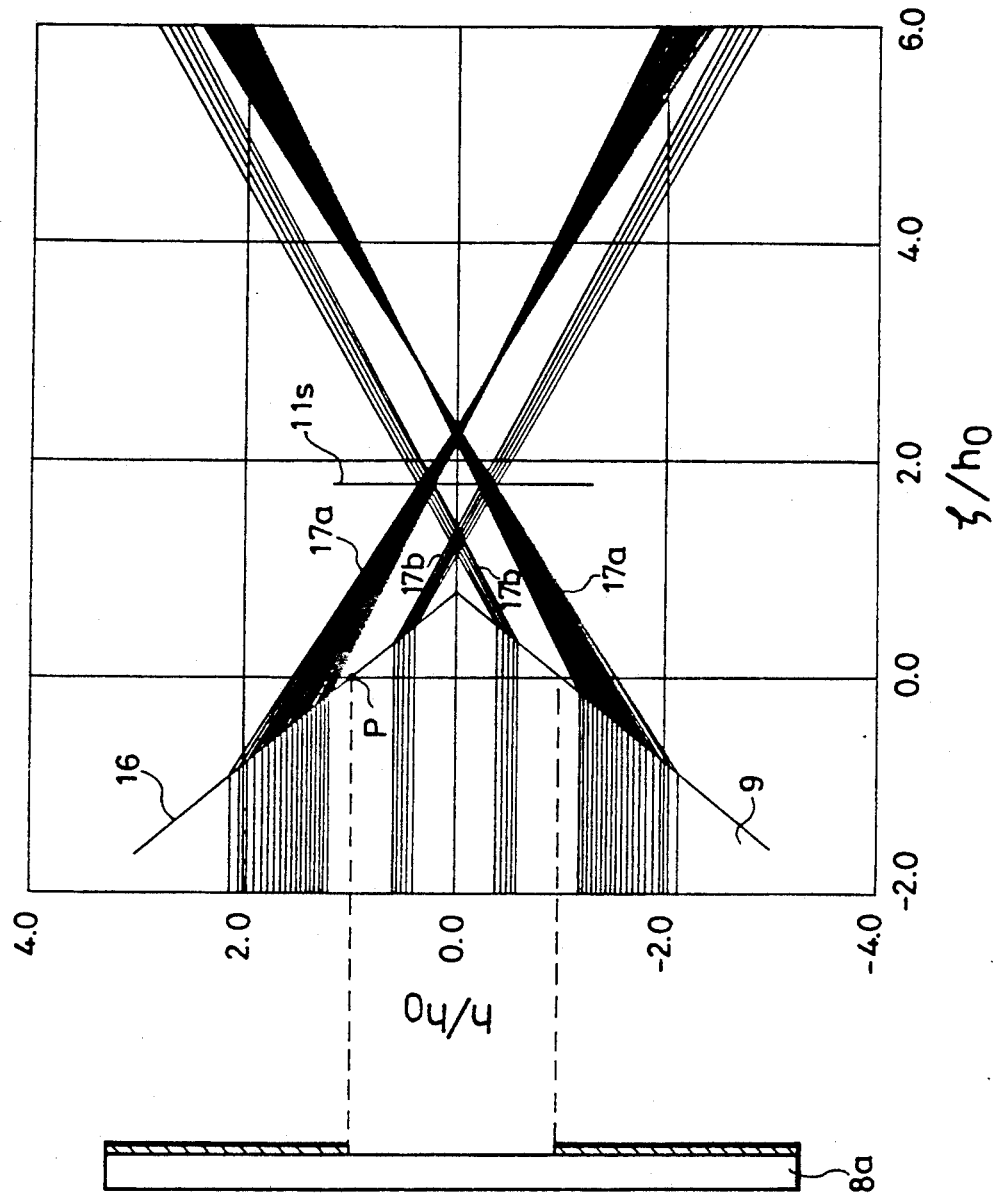
FIG. 10 is a ray tracing diagram of refracted light by the exposure apparatus.
Figure 11:
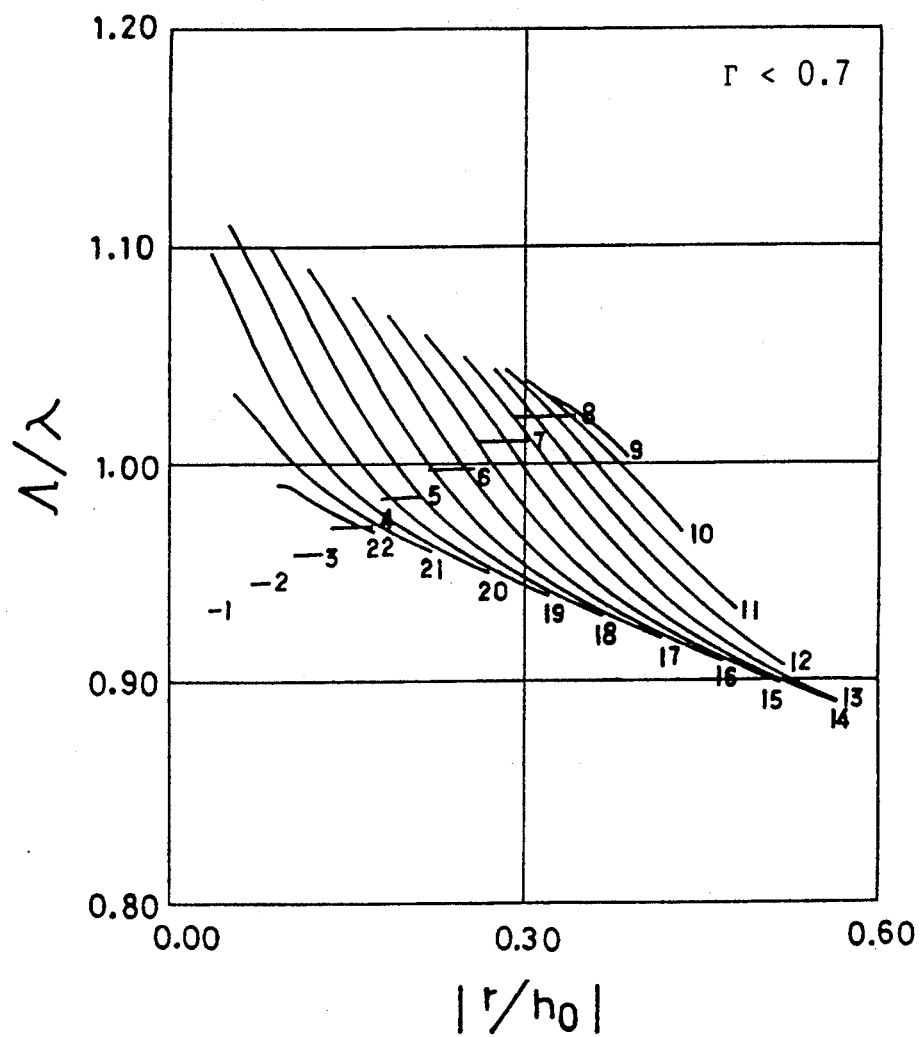
FIG. 11 and FIG. 12 show the relation between the patterning pitch $\Lambda/\lambda$ and the radius vector $|r/h_0|$ under the condition of a contrast of 70% or less ($\Gamma < 0.7$) in the first embodiment of the present invention, wherein FIG. 11 corresponds to a case without using a ND filter, whereas FIG. 12 corresponds to a case using a ND filter.
Figure 12:
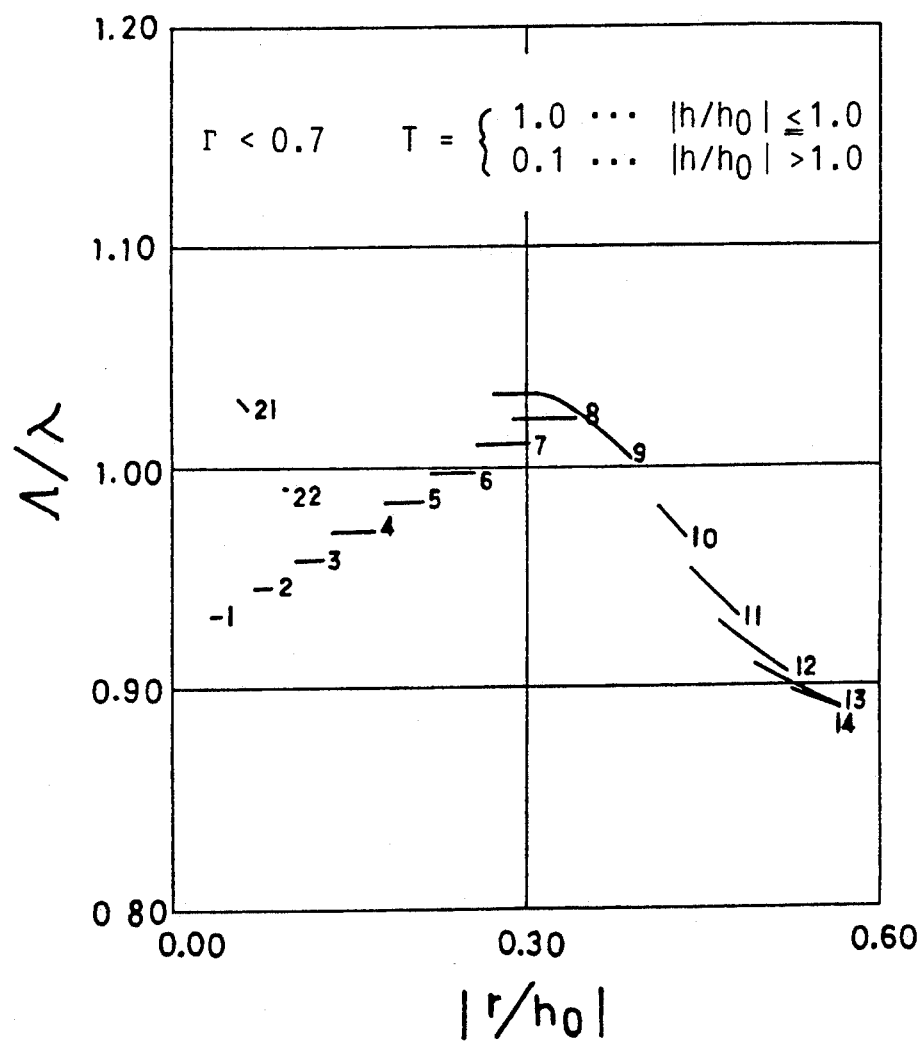

FIG. 10 is a ray-trace of refracted light of an exposure apparatus in the embodiment of the present invention. The refracting surface generated from a generatrix curve 16 based on Equation 2 forms a convex surface at the outer side of its inflection point P while it forms a concave surface at the inner side. Therefore, light rays 17a which are refracted at outer side of the point P form a converging light, whereas the rays 17b which are refracted at inner side of the point P form a diverging light. Namely, when the light intensity before the refraction is uniform (this is realized by excluding an ND filter 8a or when its transmission distribution T is uniform), light intensity between two light fluxes (17a and 17b) at the exposure position 11S differs greatly, causing a decrease in the contrast. Therefore, as is shown in FIG. 10, if a ND filter having a distribution of transmission 100% for $|h/h_0| \leq 1$ and a distribution of transmission $T_0$ for $|h/h_0| \geq 1$ is inserted in front of the interference lens 9, by optimizing the transmission $T_0$ the light intensities between those two light fluxes can be balanced, making it possible to improve the contrast. A calculated result from Equation 7 showing the relation between the patterning pitch $\Lambda/\lambda$ and the radius vector $|r/h_0|$ under a condition of a contrast less than 70% ($\Gamma<0.7$) for the case without the ND filter 8a is shown in FIG. 11. In the figure, curves 1 to 22 correspond respectively to curve numbers in FIG. 5. From a comparison between FIG. 6 and FIG. 11, for those curves 9 through 21, contrast becomes less than 70% for almost all the regions wherein the pitch modulation takes place. In contrast with this, FIG. 12 is a calculated result showing the relation between the patterning pitch $\Lambda/\lambda$ and the radius vector $|r/h_0|$ under a condition of a contrast less than 70% ($\Gamma<0.7$) the case of inserting an ND filter 8a of $T_0=0.1$ (10%). It is understood that thus the contrast is improved largely. Hereupon, light path-length difference between those two light fluxes caused by the insertion of the ND filter 8a is small, and hence also from this point of view, it relaxes the condition for obtaining a good exposure contrast. On the other hand, in the case where the generatrix curve 16 has a multiple number of inflection points, the exposure contrast can be improved, by making the ND filter to be a filter having stepwisely different transmissions with circular boundaries, whose radii correspond to the distances of respective inflection points from the optical axis, and by optimizing the transmission of respective regions sandwiched by respective circles.

As has been described above, the embodiment of the present invention has the following features: (1) Since the optical system for generating the interference light fluxes can be composed of a single rotation-symmetric interference lens, adjustment of the optical system is accomplished only by paying attention to the concentricity of the optical axis and of the interference lens.

Therefore, as long as the accuracy of the interference lens is sufficient, even for a grating pattern having a narrow pitch, it becomes easy to obtain a high accuracy as well as a uniformity in its periodicity. (2) It is possible to obtain a grating pitch which is less than the wavelength. (3) It is possible to expose a periodic grating of concentric circular shape starting directly from zero-radius. (4) It is possible to modulate effectively the period of a grating pattern in the radius vector direction. (5) The period modulation of a grating pattern can be finely controlled by adjusting the position of the exposure plane. (6) By a suitable combination with a patterning mask, the exposure region can be specified. (7) By an optimization of the ND filter, a good exposure contrast can be obtained. (8) When the feasibility of fabrication of the interference lens is achieved, a large area grating can easily be made.

Hereupon, in the first embodiment, the generatrix curve 16 (FIG. 4) of the exit surface 9S of the interference lens can follow equations other than than Equation 2. For example, in the case in which a generatrix curve is a curve having a point of inflection, and in particular, the curve generates a convex surface outside of this point, while it generates a concave surface inside of this point, then in such case, an interference, which is made between the light refracting at the outside and the the light refracting at the inside, can form a periodic pattern, which has a large pitch modulation ratio in the radius vector direction. And in the case where the generatrix curve 16 is a straight line (that is, the exit surface is a circular cone), a periodic pattern of a constant pitch can be formed.

It is also possible to insert a lens system of convex or concave lenses between the collimator lens 7 and the interference lens 9 (FIG. 3), or between the interference lens 9 and the sample substrate 10. In such case, since the number of designing parameters (for example, position or focal length of lenses) increases, there is an effect that the degree of freedom in designing the interference lens 9 increases also, thereby making possible a fine control of the period modulation of the grating pattern by adjusting the position of the lens system along the optical axis. The ND filter 8a or the patterning mask 8b can also be placed between the interference lens 9 and the sample substrate 10, thereby it is possible to balance the light intensity between two light fluxes or to form regions wherein no lights pass at all as in the embodiment, and it is also possible to make exposures independently to each region by a combination of patterning masks 8b.

Further, it is possible to convert the concentric circular periodic bright and dark pattern into an elliptical shape by tilting the sample substrate 10 with respect to the optical axis using an x-y tilting stage.

A second embodiment of the present invention will now be described with respect to FIG. 13.

The second embodiment has the same optical arrangement as that of the first embodiment, excluding the shape of the patterning mask. FIG. 13 shows a relation between the shape of the patterning mask and light interference regions on a plane normal to the optical axis in the second embodiment of the present invention.

Figure 13A:
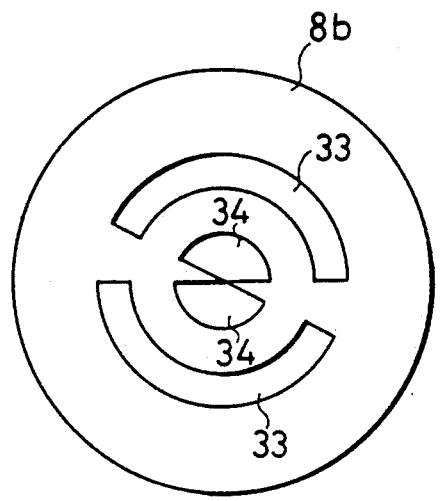
FIGS. 13A, 13B, 13C and 13D are explanatory drawings showing the relation between a shape of a patterning mask and a light interference region and of an exposure apparatus in a second embodiment of the present invention.
Figure 13B:
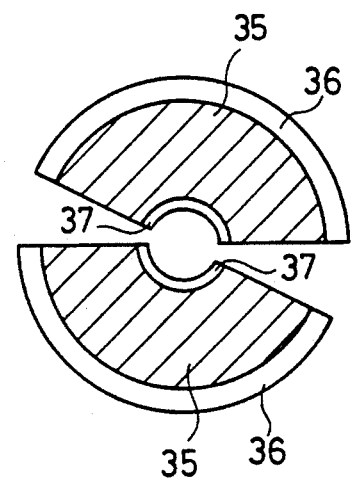

That is, as shown in FIG. 13(a) when a patterning mask 8b is a mask which masks light in areas other than those of an axial symmetric shape (where numeral 33 is a pair of fan-shaped rings, numeral 34 designates a pair of fan-shapes, and their centers coincide with the center axis 9L of the interference lens), the interference regions are of an axial symmetric shape 35 (fan-shaped ring pair) as shown in FIG. 13(b).

Shapes 36 and 37 (both being fan-shaped circular ring pair) sandwiching the shape 35 are non-interference regions wherein the light passes through but interference does not take place (wherein no two light fluxes to make mutual interference exist).

Interference regions in FIG. 13(b) correspond to cross-sectional shapes of interference regions shown in FIG. 8(c) which are shown by cutting out a plane 32 which is normal to the center axis 9L, and a shape 36 (fan-shaped ring pair) corresponds to regions 29a and 29d. In FIG. 13(b), a shape 37 (fan-shaped ring pair) corresponds to regions 28a and 28b.

Figure 13C:
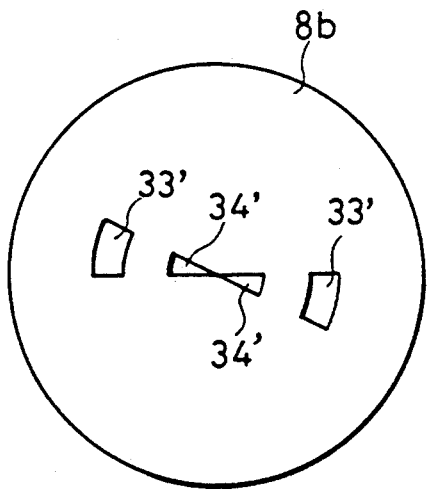
Figure 13D:
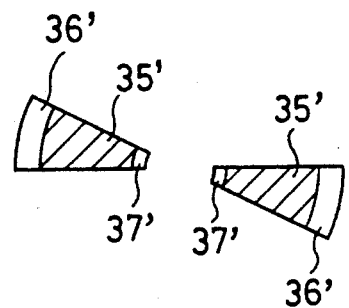

On the other hand, as shown in FIG. 13(c), if the patterning mask 8b is a mask which makes light masking in areas other than those axial symmetric shapes 33' and 34' (where numeral 33' is a shape resulted by subtracting the shape of 33 (of FIG. 13(a)) from its corresponding circular ring, and numeral 34' is a shape resulted by subtracting the shape of 34 (of FIG. 13(a)) from its corresponding circle), as shown in FIG. 13(d), the interference region is of a shape 35' which is resulted by subtracting shapes 36 and 37 from their corresponding circular ring.

Shapes 36' and 37' are also shapes which are resulted by subtracting the shapes 36 and 37 respectively from their corresponding circular rings, and they are regions wherein the light passes through but interference does not take place (there are no two light fluxes to make mutual interference exist).

As has been shown in FIG. 6, the curves representing the relation between the patterning pitch $\Lambda/\lambda$ and the radius vector $|r/h_0|$ vary with the position of the photosensitive film surface 11S.

Therefore, by making such a procedure consisting of after a step of making an exposure using a patterning mask as shown in FIG. 13(a), a step of replacing the mask to the mask of FIG. 13(c), a step of moving the sample substrate 10 along the axis 9L (that is, in the direction of an arrow 13 in FIG. 3) and then making another exposure again, the exposure of a periodic pattern becomes possible in which periodicity follows different pitch rules depending upon the regions 35 or 35'. Hereupon, since the interference regions also vary as the sample substrate moves, the patterning mask in FIG. 13(c) must be a of shape which takes this variation into account. Besides, the shape of the transmission region is not limited to the fan-shape or the fan-shaped circular ring. A suitable combination of those masking patterns can specify regions on which the periodic pattern is formed as long as it is an axial symmetric masking.

Figure 14A:
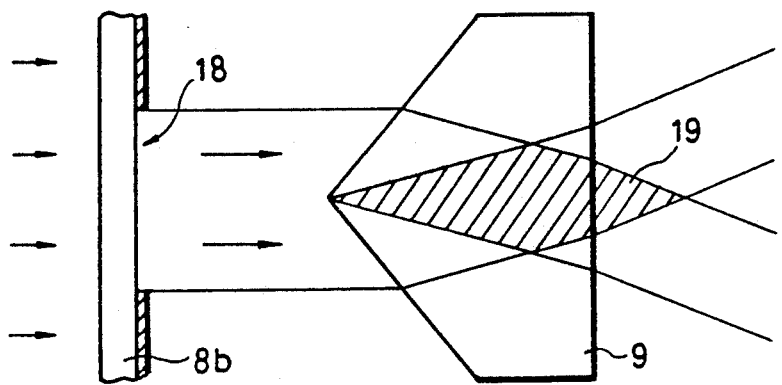
FIGS. 14A, 14B and 14C are explanatory drawings showing the relation between a cross-sectional shape of a patterning mask and a light interference region of an exposure apparatus in a third embodiment of the present invention.
Figure 14B:
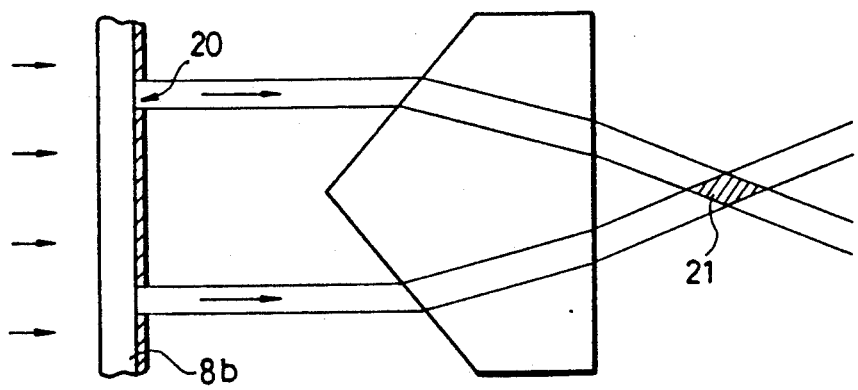
Figure 14C:
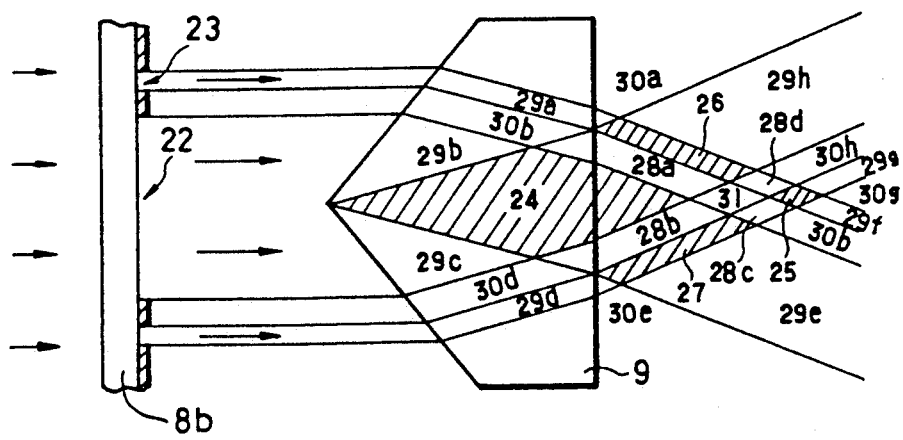

In the following, explanation is given with reference to FIG. 14 of a third embodiment of the present invention.

The third embodiment has the same configuration as that of the first embodiment except that the interference lens is placed in a direction which is opposite to that in the first embodiment. FIG. 14 shows a relation between the cross-sectional shape of the patterning mask and the cross-section of the light interference regions in the third embodiment of the present invention. Since this embodiment gives the same result as in FIG. 8, the same numerals are given to the same parts in this figure, and their detailed explanations are omitted here.

Hereupon, other than the first and the third embodiments, it is also possible to take such constitutions that both of the incident surface 9P and the exit surface 9S of the interference lens 9 can be made to be surfaces of revolution of curves, they can give the same effect as in the first and the third embodiments.

What is claimed is:

1. An exposure apparatus comprising:
   a laser light source for generating laser light having an optical axis,
   a refractive body for letting said laser light transmit therethrough and refract, the refractive body having a refracting surface,
   a photosensitive film formed on a flat plane which is substantially perpendicular to the optical axis of said laser light,
   wherein the refracting surface of said refractive body is a surface of revolution having the optical axis as its axis of revolution and a curved generatrix, and
   wherein light flux refracted at respective paired diagonal generatrices of said refracting surface intersect with each other in the vicinity of the optical axis to thereby interfere to form a fringe pattern having concentric circular periodic bright and dark parts to which said photosensitive film is exposed.

2. An exposure apparatus of claim 1 wherein
   said curved generatrix is a curve having at least one inflection point.

3. An exposure apparatus of claim 2 further comprising a light masking body between said laser light source and refractive body or between said refractive body and the photosensitive flat plane, the light masking body masking the transmitted light through circular ring shape regions which are concentric with respect to the optical axis, wherein said inflection point is present inside the circular regions.

4. An exposure apparatus of claim 1 wherein
   said refracting surface includes a convex surface and a concave surface,
   said convex surface being closer to an outer edge of said body than said concave surface.

5. An exposure apparatus of claim 1 further comprising a filter having stepwisely different transmission regions having circular boundaries between said laser light source and refractive body or between said refractive body and the photosensitive flat plane, and wherein said refracting surface includes a convex surface and a concave surface.

6. An exposure apparatus of claim 5 wherein
   a radius of said transmission region boundary corresponds to a radius of a boundary circle by which the convex surface and the concave surface are separated, and
   transmission outside said transmission region boundary is smaller than transmission inside said boundary region.

7. An exposure apparatus of claim 1 further comprising a light masking body between said laser light source and said refractive body or between said refractive body and the photosensitive flat plane which masks the transmitted light through those regions of circles or group of rings which are concentric with the optical axis.

8. An exposure apparatus of claim 1 further comprising a light masking body between said laser light source and refractive body or between said refractive body and the photosensitive flat plane, the light masking body masking the transmitted light through symmetric shape regions which are symmetric with respect to the optical axis.

9. An exposure apparatus of claim 1 further comprising a wavefront conversion means for enabling control of the period of the fringe pattern between said laser light source and the refractive body or between said refractive body and the photosensitive flat plane.

10. An exposure apparatus of claim 9 further comprising a sliding means which displaces said wavefront conversion means, said fringe pattern being adjusted by changing the positional relation of said wavefront conversion means with respect to said refractive body.

11. An exposure apparatus of claim 1 further comprising an expander means which expands the size of the laser light between said laser light source and refractive body.

12. An exposure apparatus of claim 1 further comprising a quarter-wave plate between said laser light source and refractive body, the quarter-wave plate converting the laser light into a circularly polarized light which reaches said refractive body.

13. An exposure apparatus stated in claim 1 further comprising a sliding means which displaces said flat plane, whereby said fringe pattern being adjusted by changing the positional relation of said flat plane with respect to said refractive body.

14. An exposure apparatus stated in claim 1 which further comprises a tilting means which tilts said photosensitive flat plate with respect to the optical axis, thereby to convert said fringe formed on said photosensitive flat plate into an elliptical shape.

* * * * *